United States Patent [19]

Petuch

[11] 4,301,921
[45] Nov. 24, 1981

[54] SEPARATING REELED COILS

[75] Inventor: Andrew J. Petuch, Oberlin, Pa.

[73] Assignee: AMP Incorporated, Harrisburg, Pa.

[21] Appl. No.: 241,282

[22] Filed: Mar. 6, 1981

[51] Int. Cl.³ .............................................. B65D 73/02
[52] U.S. Cl. .................................. 206/330; 206/390;
206/583; 206/806; 206/820; 206/485
[58] Field of Search .............. 206/328, 329, 330, 331,
206/390, 389, 583, 806, 820, 485

[56] References Cited
U.S. PATENT DOCUMENTS 2,604,986  6/1952  Berg ...................................... 206/59
3,254,760  6/1966  Walker ................................. 206/59
3,692,264  9/1972  Burkhard et al. ................... 206/583
4,004,688  1/1977  Braden ................................ 206/330
4,069,916  1/1978  Fowler et al. ..................... 206/330
4,165,807  8/1979  Yagi .................................... 206/330

Primary Examiner—Joseph Man-Fu Moy
Attorney, Agent, or Firm—Gerald K. Kita

[57] ABSTRACT

A rail for supporting edges of a continuous carrier strip, interconnecting serially arranged electrical components, comprises a continuous plastic extrusion which clips upon edges of the carrier strip and provides a spacer for separating reeled coils of the carrier strip when the same is reeled on a storage spool.

3 Claims, 3 Drawing Figures

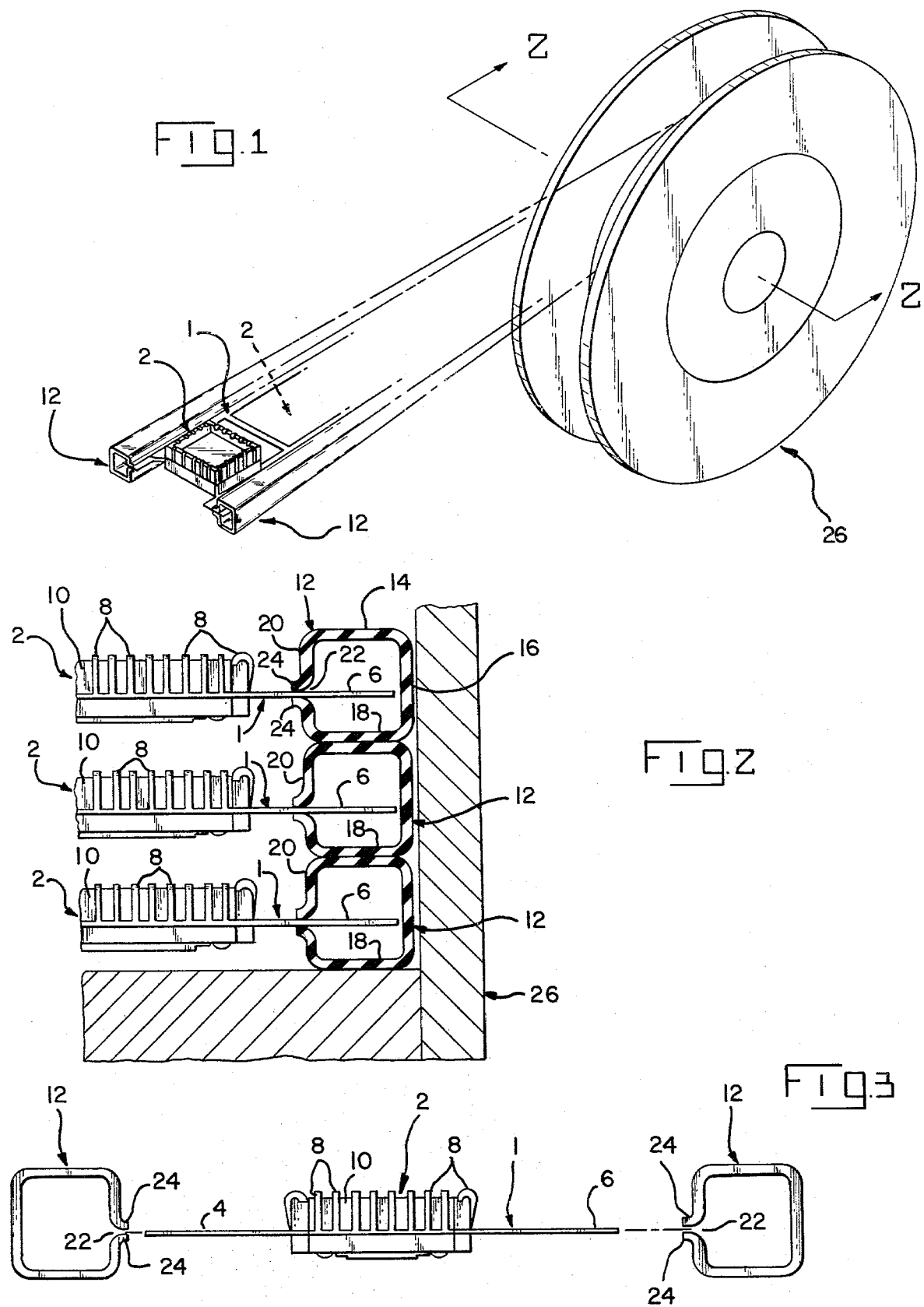

SEPARATING REELED COILS

FIELD OF THE INVENTION

The present invention relates to reeled storage of a continuous length of strip material, as well as to a means for separating reeled coils of strip material and for protecting the coils from damaging one another.

BACKGROUND OF THE PRIOR ART

Packages for electronic devices are manufactured of metal and plastic materials. Using automated processes, the packages are fabricated directly into a continuous metal strip, portions of which are stamped and formed to provide electrical contacts incorporated into the packages, and other portions of which interconnect the packages serially along the strip. An example of carrier strip mounted packages is disclosed in U.S. Pat. No. 4,195,193. The packages are thicker than the carrier strip and tend to damage one another when they, together with the strip, are reeled into coils on a storage spool. Therefore, some means is needed which separates successive, reeled coils and the packages thereon from one another.

SUMMARY OF THE INVENTION

The present invention relates to a rail for mounting on the edges of a continuous strip and reeling onto a storage spool. The rail is fabricated by extrusion of plastics material and has a hollow core interior which provides substantial height for the rail with minimum supporting material. The rail has a continuous slot along one side thereof which mounts the rail continuously along an edge of the strip.

OBJECTS

An object of the present invention is to provide an inexpensive means for separating successive reeled coils of a continuous strip.

Another object is to provide an extruded plastic rail of continuous slotted construction for mounting over an edge of a continuous strip to separate reeled coils of the strip and to separate electronic packages carried by the strip, from one another.

Other objects and advantages of the present invention will become apparent in the following detailed description taken in conjunction with the drawings.

BRIEF DESCRIPTION OF THE DRAWINGS

FIG. 1 is a perspective of a metal continuous strip carrying electronic packages, and assembled with a preferred embodiment of a rail according to the invention reeled together with the strip and packages onto a storage spool.

FIG. 2 is an enlarged fragmentary section taken along the line 2—2 of FIG. 1.

FIG. 3 is an elevation of the end of the strip shown in FIG. 1, and further illustrating each rail exploded from a respective side edge of the strip.

DETAILED DESCRIPTION OF THE PREFERRED EMBODIMENT

With more particular reference to FIGS. 1 and 3 of the drawings, a continuous, flexible metal strip 1 is provided with a series of plastics electronic packages 2 integrally formed by injection molding directly on the strip. A more detailed description of electronic packages on a strip is contained in U.S. Pat. No. 4,195,193, issued Mar. 25, 1980. For the purpose of the present invention, the strip 1 is described as a ribbon with continuous planar side edges 4, 6. Additional portions of the strip 1 are stamped and formed into groups of electrical contacts 8 which are injection molded into respective insulative plastic frames 10 for respective packages 2. Both the frame and associated contacts are thicker than the strip 1, projecting outwardly in both directions from the strip thickness. The strip conveniently provides a means for conveying the packages serially and for reeling the packages onto a storage spool.

The present invention protects the packages from striking and damaging one another while on a storage spool. FIGS. 1-3 illustrate a rail, generally at 12, of continuous extruded plastics material, having a hollow interior defined by a top wall 14, a sidewall 16, a bottom wall 18, and a sidewall 20 bifurcated by a continuous slot 22 of narrow width parallel to the walls 14 and 18. The continuous side edges 24 of the slot 22 which face each other have smoothly rounded surfaces to provide a cushioned, gripped support on a respective edge 4 or 6 of the strip 1. A smooth surface on each edge 24 is formed by extrusion apparatus during manufacture of the rail 12. As the rail 12 emerges from the extrusion apparatus, it is somewhat misshapen with a slot 22 which is wider than desirable to facilitate smooth formation of the edges 24. Before the plastics material is fully cooled and rigidized, the rail 12 is formed to its final configuration, with a narrow slot and with walls 14 and 18 planar and parallel. A rail is assembled over each edge 4 and 6 and is flexible for reeling, together with the strip 1, into coils on a storage spool 26. FIG. 2 shows parallel walls 14 and 18 flatly supporting the successive coils even when arcuately wound. The walls 14 and 18 project beyond the thickness of each package 2, suspending the packages 2 and separating packages of successive coils from one another. When the coils are dereeled, the rails suspend the packages when the rails are supported on a work table (not shown). The rails are readily removed from the strip 1 and cover only waste portions of the strip, leaving the packages 2 fully exposed for further assembly line operations.

Although a preferred embodiment of the present invention is disclosed, other embodiments and modifications which would be apparent to one having ordinary skill is intended to be covered by the spirit and scope of the appended claims.

What is claimed is:

1. A rail for supporting a continuous carrier strip on which are provided a series of electronic packages, the combination comprising:
   a metal carrier strip,
   a series of electronic packages integrally formed along said carrier strip,
   each side edge of said carrier strip interfitting with a removable rail having a hollow interior, a top wall, a bottom wall and sidewalls one of which is bifurcated with a continuous slot receiving a respective said side edge, and said top wall and said bottom wall supporting successive reeled coils of said carrier strip and separating said packages of said successive coils from one another.

2. The structure as recited in claim 1, wherein edges of said slot are smoothly rounded.

3. The structure as recited in claim 2, wherein said top wall and said bottom all are parallel to said slot and support successive coils of said strip.

* * * * *

UNITED STATES PATENT OFFICE
CERTIFICATE OF CORRECTION

Patent No. 4,301,921          Dated November 24, 1981

Inventor(s) Andrew J. Petuch

It is certified that error appears in the above-identified patent and that said Letters Patent are hereby corrected as shown below:

Claim 3, Column 2, Line 66, that portion reading:

". . . and said bottom all are . . ." should read,
". . . and said bottom wall are . . ."

Signed and Sealed this

Twenty-eighth Day of June 1983

[SEAL]

Attest:

Attesting Officer

GERALD J. MOSSINGHOFF

Commissioner of Patents and Trademarks